United States Patent
Nacev et al.

(10) Patent No.: US 11,609,291 B2
(45) Date of Patent: Mar. 21, 2023

(54) SINGLE-SIDED FAST MRI GRADIENT FIELD COILS AND APPLICATIONS THEREOF

(71) Applicant: PROMAXO, INC., Oakland, CA (US)

(72) Inventors: Aleksandar Nacev, San Francisco, CA (US); Pulkit Malik, Oakland, CA (US)

(73) Assignee: Promaxo, Inc., Oakland, CA (US)

( * ) Notice: Subject to any disclaimer, the term of this patent is extended or adjusted under 35 U.S.C. 154(b) by 0 days.

(21) Appl. No.: 17/438,894

(22) PCT Filed: Mar. 25, 2020

(86) PCT No.: PCT/US2020/024776
§ 371 (c)(1),
(2) Date: Sep. 13, 2021

(87) PCT Pub. No.: WO2020/198395
PCT Pub. Date: Oct. 1, 2020

(65) Prior Publication Data
US 2022/0091207 A1    Mar. 24, 2022

Related U.S. Application Data (60) Provisional application No. 62/823,521, filed on Mar. 25, 2019.

(51) Int. Cl.
*G01R 33/385* (2006.01)
(52) U.S. Cl.
CPC ............... *G01R 33/3856* (2013.01)

(58) Field of Classification Search
CPC .................. G01R 33/3856; G01R 33/385
See application file for complete search history.

(56) References Cited

U.S. PATENT DOCUMENTS 5,075,624 A * 12/1991 Bezjak ............... G01R 33/3657
324/318
5,304,930 A    4/1994 Crowley et al.
(Continued)

FOREIGN PATENT DOCUMENTS

CN    206453772 U    9/2017
DE    102004039420 A1    2/2006
(Continued)

OTHER PUBLICATIONS

International Search Report and Written Opinion for International PCT Application No. PCT/US2020/024776, dated Jun. 22, 2020.
(Continued)

*Primary Examiner* — Jay Patidar
(74) *Attorney, Agent, or Firm* — K&L Gates LLP (57) ABSTRACT

A single-sided gradient coil set for single-sided magnetic resonance imaging system is disclosed. The coil set is configured to generate a magnetic field outwards away from the coil set. The coil set includes one or more first spiral coils at a first position relative to the aperture and one or more second spiral coils at a second position relative to the aperture. The coil set is configure to flow a current through the one or more first spiral coils and the one or more second spiral coils to generate an electromagnetic field gradient configured to project away from the coil set and into an imaging region of the magnetic imaging system.

23 Claims, 6 Drawing Sheets

(56) References Cited

U.S. PATENT DOCUMENTS

| | | | |
|---|---|---|---|
| 5,736,858 A * | 4/1998 | Katznelson | G01R 33/385 324/318 |
| 5,952,830 A | 9/1999 | Petropoulos et al. | |
| 6,208,142 B1 | 3/2001 | Wagshul | |
| 6,696,837 B2 * | 2/2004 | Konijn | G01R 33/385 324/318 |
| 2003/0146750 A1 | 8/2003 | Vaughan, Jr. | |
| 2003/0197507 A1 | 10/2003 | Liu | |
| 2004/0227516 A1 | 11/2004 | Endt | |
| 2004/0251901 A1 | 12/2004 | Tsuda et al. | |
| 2005/0148864 A1 | 7/2005 | Slade et al. | |
| 2008/0054903 A1 | 3/2008 | Possanzini et al. | |
| 2009/0112082 A1 | 4/2009 | Piferi et al. | |
| 2011/0012599 A1 | 1/2011 | Gao et al. | |
| 2011/0273177 A1 | 11/2011 | McGinley et al. | |
| 2012/0010497 A1 * | 1/2012 | Ehman | G01R 33/56358 600/410 |
| 2016/0259020 A1 | 9/2016 | Okamoto | |
| 2019/0079149 A1 | 3/2019 | Conolly et al. | |
| 2019/0339346 A1 * | 11/2019 | Grau Ruiz | G01R 33/3858 |

FOREIGN PATENT DOCUMENTS

| | | | |
|---|---|---|---|
| EP | 274149 A * | 7/1988 | G01R 33/385 |
| JP | H06209912 A | 8/1994 | |
| JP | 2003111744 A | 4/2003 | |
| JP | 2011115415 A | 6/2011 | |
| JP | 2018042932 A | 2/2018 | |
| WO | 2020198395 A1 | 10/2020 | |

OTHER PUBLICATIONS

Supplementary European Search Report for corresponding European Patent Application No. 20778141.0, dated Nov. 21, 2022.

* cited by examiner

SINGLE-SIDED FAST MRI GRADIENT FIELD COILS AND APPLICATIONS THEREOF

CROSS-REFERENCE TO RELATED APPLICATIONS

The present application is a U.S. National Stage Entry under 35 U.S.C. § 371 of International PCT Application No. PCT/US2020/024776, entitled "SINGLE-SIDED FAST MRI GRADIENT FIELD COILS AND APPLICATIONS THEREOF," filed Mar. 25, 2020, which claims the benefit of priority under 35 U.S.C. § 119(e) to U.S. Provisional Application No. 62/823,521, entitled "SINGLE-SIDED FAST MRI GRADIENT FIELD COILS AND APPLICATIONS THEREOF", filed on Mar. 25, 2019, which are incorporated by reference herein in their respective entireties.

BACKGROUND

Magnetic resonance imaging (MRI) systems have primarily been focused on leveraging an enclosed form factor. This form factor includes surrounding the imaging region with electromagnetic field producing materials and imaging system components. A typical MRI system includes a cylindrical bore magnet where the patient is placed within the tube of the magnet for imaging. Components, such as radio frequency (RF) transmission (TX), RF reception (RX) coils, and electromagnetic gradient generating coils are then placed on many sides of the patient to effectively surround the patient in order to perform the imaging.

Typically, the electromagnetic gradient generating coils are large and fully surround the field of view (i.e., the imaging region) so as to create a linear and monotonic magnetic field gradient throughout the entire field of view. The placement of components, in most current MRI systems, virtually surrounds the patient severely limiting patient movement, and which can sometimes cause additional burdens during situating or removing the patient to and from the imaging region. Therefore, a need exists to provide modern imaging configurations in next generation MRI systems that further alleviate the aforementioned issues with regards to patient comfort and burdensome limitations.

SUMMARY

At least one aspect of the disclosure is directed to a magnetic imaging apparatus. The apparatus includes a power source for providing a current and a single-sided gradient coil set connected to the power source. In accordance with various embodiments, the coil set includes an aperture. In accordance with various embodiments, the coil set also includes one or more first spiral coils at a first position relative to the aperture and one or more second spiral coils at a second position relative to the aperture. In accordance with various embodiments, the first position is across from the second position with respect to the aperture. In some implementations of the apparatus, the coil set is configured to receive a current through the one or more first spiral coils and the one or more second spiral coils to generate an electromagnetic field gradient configured to project away from the coil set and into an imaging region of the magnetic imaging apparatus.

In accordance with various embodiments, the coil set is non-planar and oriented to partially surround the imaging region. In accordance with various embodiments, the one or more first spiral coils and the one or more second spiral coils are non-planar with respect to the aperture and mirror each other with respect to the aperture.

In accordance with various embodiments, the electromagnetic field gradient is substantially uniform in the imaging region. In accordance with various embodiments, the electromagnetic field gradient is greater than about 5 mT. In accordance with various embodiments, the electromagnetic field gradient has a rise time less than about 10 μs.

In accordance with various embodiments, the one or more first spiral coils comprise at least two first spiral coils with at least two different diameters. In accordance with various embodiments, the one or more second spiral coils comprise at least two second spiral coils with at least two different diameters.

In some implementations of the apparatus, the current flows through the one or more first spiral coils in alternating directions to minimize a rise time of the electromagnetic field gradient.

In accordance with various embodiments, the current flows through the one or more second spiral coils in alternating directions to minimize a rise time of the electromagnetic field gradient.

In accordance with various embodiments, a primary first spiral coil of the one or more first spiral coils is configured to create a first large primary electromagnetic field gradient and a secondary first spiral coil of the one or more first spiral coils is configured to create a first small secondary electromagnetic field gradient to provide adjustments in the first large primary electromagnetic field gradient. In accordance with various embodiments, a primary second spiral coil of the one or more second spiral coils creates a second large primary electromagnetic field gradient and a secondary second spiral coil of the one or more second spiral coils creates a second small secondary electromagnetic field gradient to provide adjustments in the second large primary electromagnetic field gradient.

In accordance with various embodiments, a primary first spiral coil of the one or more first spiral coils and a secondary first spiral coil of the one or more first spiral coils adjacent to the primary first spiral coil have the current flowing through them in opposite directions. In accordance with various embodiments, a primary second spiral coil of the one or more second spiral coils and a secondary second spiral coil of the one or more second spiral coils adjacent to the primary second spiral coil have the current flowing through them in opposite directions.

In accordance with various embodiments, a primary first spiral coil of the one or more first spiral coils and a secondary first spiral coil of the one or more first spiral coils adjacent to the primary first spiral coil overlap up to 50% of respective coils to generate a more parallel first electromagnetic field gradient. In accordance with various embodiments, a primary second spiral coil of the one or more second spiral coils and a secondary second spiral coil of the one or more second spiral coils adjacent to the primary second spiral coil overlap up to 50% of respective coils to generate a more parallel second electromagnetic field gradient.

In accordance with various embodiments, the one or more first spiral coils and the one or more second spiral coils are connected to form a single current loop. In accordance with various embodiments, the one or more first spiral coils and the one or more second spiral coils comprise different materials.

In accordance with various embodiments, the one or more first spiral coils and the one or more second spiral coils have diameters between about 10 μm to about 10 m.

In accordance with various embodiments, the coil set further comprises one or more electronic components for adjusting the electromagnetic field gradient. In accordance with various embodiments, the one or more electronic components include at least one PIN diode, a mechanical relay, a solid state relay, or a MEMS switch. In accordance with various embodiments, the one or more electronic components used for tuning includes at least one of, conductive metals, metamaterials, or magnetic metals. In accordance with various embodiments, tuning the electromagnetic field gradient includes changing the current or changing physical locations of the one or more electronic components.

In accordance with various embodiments, the coil set is cryogenically cooled to reduce resistance and improve efficiency.

In accordance with various embodiments, the coil set further includes an opening opposite the aperture, wherein the region between the aperture and the opening defines a coil set region, and wherein the imaging region is at least partially disposed outside the coil set region.

At least one aspect of the disclosure is directed to a method for using a magnetic imaging apparatus. The method includes providing a power source and providing a single-sided gradient coil set connected to the power source. In accordance with various embodiments, the coil set includes an aperture. In accordance with various embodiments, the coil set comprises one or more first spiral coils at a first position relative to the aperture and one or more second spiral coils at a second position relative to the aperture. In accordance with various embodiments, the first position is across from the second position with respect to the aperture.

In accordance with various embodiments, the method includes turning on the power source so as to flow a current through the one or more first spiral coils and the one or more second spiral coils to generate an electromagnetic field gradient that is projected away from the coil set and into an imaging region of the magnetic imaging apparatus.

In accordance with various embodiments, the electromagnetic field gradient is greater than about 5 mT. In accordance with various embodiments, the electromagnetic field gradient has a rise time less than about 10 µs.

In accordance with various embodiments, the coil set further comprises one or more electronic components from one of a PIN diode, a mechanical relay, a solid state relay, or a MEMS switch. In accordance with various embodiments, the method further includes tuning the electromagnetic field gradient by changing the current or by changing one of physical properties or locations of the one or more electronic components.

In accordance with various embodiments, the coil set further includes an opening opposite the aperture, wherein the region between the aperture and the opening defines a coil set region, and wherein the imaging region is at least partially disposed outside the coil set region.

At least one aspect of the disclosure is directed to a magnetic imaging apparatus. The apparatus includes a power source for providing a current and a single-sided gradient coil set connected to the power source, wherein the coil set is configured to generate an electromagnetic field gradient having a rise time less than about 10 us and configured to project away from the coil set and into an imaging region of the magnetic imaging apparatus.

In accordance with various embodiments, the coil set further includes an aperture, and one or more first spiral coils at a first position relative to the aperture and one or more second spiral coils at a second position relative to the aperture, the first position being across from the second position with respect to the aperture.

In accordance with various embodiments, the coil set is non-planar and oriented to partially surround the imaging region. In accordance with various embodiments, the one or more first spiral coils and the one or more second spiral coils are non-planar with respect to the aperture and mirror each other with respect to the aperture.

In accordance with various embodiments, the electromagnetic field gradient is substantially uniform in the imaging region. In accordance with various embodiments, the electromagnetic field gradient is greater than about 5 mT.

In accordance with various embodiments, the one or more first spiral coils comprise at least two first spiral coils with at least two different diameters. In accordance with various embodiments, the one or more second spiral coils comprise at least two second spiral coils with at least two different diameters.

In some implementations of the apparatus, the current flows through the one or more first spiral coils in alternating directions to minimize a rise time of the electromagnetic field gradient.

In accordance with various embodiments, the current flows through the one or more second spiral coils in alternating directions to minimize a rise time of the electromagnetic field gradient.

In accordance with various embodiments, a primary first spiral coil of the one or more first spiral coils is configured to create a first large primary electromagnetic field gradient and a secondary first spiral coil of the one or more first spiral coils is configured to create a first small secondary electromagnetic field gradient to provide adjustments in the first large primary electromagnetic field gradient. In accordance with various embodiments, a primary second spiral coil of the one or more second spiral coils creates a second large primary electromagnetic field gradient and a secondary second spiral coil of the one or more second spiral coils creates a second small secondary electromagnetic field gradient to provide adjustments in the second large primary electromagnetic field gradient.

In accordance with various embodiments, a primary first spiral coil of the one or more first spiral coils and a secondary first spiral coil of the one or more first spiral coils adjacent to the primary first spiral coil have the current flowing through them in opposite directions. In accordance with various embodiments, a primary second spiral coil of the one or more second spiral coils and a secondary second spiral coil of the one or more second spiral coils adjacent to the primary second spiral coil have the current flowing through them in opposite directions.

In accordance with various embodiments, a primary first spiral coil of the one or more first spiral coils and a secondary first spiral coil of the one or more first spiral coils adjacent to the primary first spiral coil overlap up to 50% of respective coils to generate a more parallel first electromagnetic field gradient. In accordance with various embodiments, a primary second spiral coil of the one or more second spiral coils and a secondary second spiral coil of the one or more second spiral coils adjacent to the primary second spiral coil overlap up to 50% of respective coils to generate a more parallel second electromagnetic field gradient.

In accordance with various embodiments, the one or more first spiral coils and the one or more second spiral coils are connected to form a single current loop. In accordance with various embodiments, the one or more first spiral coils and the one or more second spiral coils comprise different materials.

In accordance with various embodiments, the one or more first spiral coils and the one or more second spiral coils have diameters between about 10 µm to about 10 m.

In accordance with various embodiments, the coil set further comprises one or more electronic components for adjusting the electromagnetic field gradient. In accordance with various embodiments, the one or more electronic components include at least one PIN diode, a mechanical relay, a solid state relay, or a MEMS switch. In accordance with various embodiments, the one or more electronic components used for tuning includes at least one of, conductive metals, metamaterials, or magnetic metals. In accordance with various embodiments, tuning the electromagnetic field gradient includes changing the current or changing physical locations of the one or more electronic components.

In accordance with various embodiments, the coil set is cryogenically cooled to reduce resistance and improve efficiency.

In accordance with various embodiments, the coil set further includes an opening opposite the aperture, wherein the region between the aperture and the opening defines a coil set region, and wherein the imaging region is at least partially disposed outside the coil set region.

At least one aspect of the disclosure is directed to a method for using a magnetic imaging apparatus. The method includes providing a power source and providing a single-sided gradient coil set connected to the power source. The method includes turning on the power source so as to flow a current through the coil set. The method includes generating an electromagnetic field gradient having a rise time less than about 10 µs. The method includes projecting the electromagnetic field gradient away from the coil set and into an imaging region of the magnetic imaging apparatus.

In accordance with various embodiments, the electromagnetic field gradient is greater than about 5 mT.

In accordance with various embodiments, the coil set further comprises one or more electronic components from one of a PIN diode, a mechanical relay, a solid state relay, or a MEMS switch. In accordance with various embodiments, the method further includes tuning the electromagnetic field gradient by changing the current or by changing one of physical properties or locations of the one or more electronic components.

In accordance with various embodiments, the coil set further includes an opening opposite the aperture, wherein the region between the aperture and the opening defines a coil set region, and wherein the imaging region is at least partially disposed outside the coil set region.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

Typical electromagnetic gradient coil configurations for MRI systems are large and usually surround the field of view, i.e., the imaging region. In particular, coils used for generating a gradient magnetic field for spatial encoding during magnetic imaging are typically large and usually placed on multiple sides of the patient. The gradient magnetic field coils are typically constructed in a curved fingerprint configuration that shapes into a cylindrical form factor. The gradient magnetic field coils are designed so that the generated magnetic field is linear over the region of interest, i.e., the imaging region, in order to create straightforward mathematical reconstructions of MRI images. For a typical MRI system, the gradient magnetic field will be more linear in the imaging region, the more the coils surround the patient. Therefore, gradient magnetic field coils are specifically designed to encompass a patient. However, such configuration of the gradient magnetic field coils fails when the form factor modernizes to a single sided MRI system where surrounding the patient is no longer an option.

To further improve patient comfort and reduce burdensome movement limitations of the current MRI systems, single-sided MRI systems have been developed. The disclosure as described herein generally relates to a magnetic imaging apparatus of a single-sided MRI system and its applications. In particular, the described technology relates to a magnetic imaging apparatus having a single-sided gradient coil set comprising several gradient magnetic field spiral coils configured to work in a single-sided MRI system. As described herein, the disclosed single-sided MRI system can be configured so that the patient is covered on one side, but not completely surrounded, by the electromagnetic field producing materials and imaging system components. The configurations as described herein offer less restriction in patient movement while reducing unnecessary burden during situating and/or removing of the patient from the MRI system. In other words, the patient would not feel entrapped in the MRI system with the placement of a single-sided gradient coil set on only one side of the patient.

The technology disclosed herein includes novel configurations of a single-sided gradient coil set, as well as methods of generating spatially changing gradient magnetic fields within the imaging region (i.e., region of interest) at a distance outward away from the single-sided gradient coil set. The single-sided gradient coil set as described herein includes one or more coil configurations that generate a near-linear field away from the coil set itself. The disclosed configurations are intended to generate a near-linear gradient field that is projected outwards and between the coil set because the coil can no longer surround the patient for imaging in a single-sided MRI system. In other words, for the gradient coil set to work in a single-sided MRI system, the gradient magnetic field for imaging has to be generated away from the coil set itself. In order to project the field out and away from the single-sided gradient coil set, the disclosed coil configurations include different sized coils that are arranged in sets or in different arrangements.

In various implementations as described herein, the single-sided gradient coil set can be configured to have a current flowing in alternating directions in the disparate spiral coils or disparate sets of spiral coils to minimize the rise-time of the gradient magnetic field and generate a spatially changing magnetic field within the region of interest projected at a distance. In various implementations as disclosed herein, the linearity of the magnetic gradient field is sufficient for the single-sided nature of a gradient magnetic field system. Moreover, the coil set configurations as disclosed herein are intended to generate a gradient magnetic field that can rise quickly to improve scan time, spatial resolution, and reduce bioeffects in the resulting images. Possible bioeffects include peripheral nerve stimulation from rapidly changing electromagnetic fields or heating due to the increased coil temperature during operation.

Figure 1:
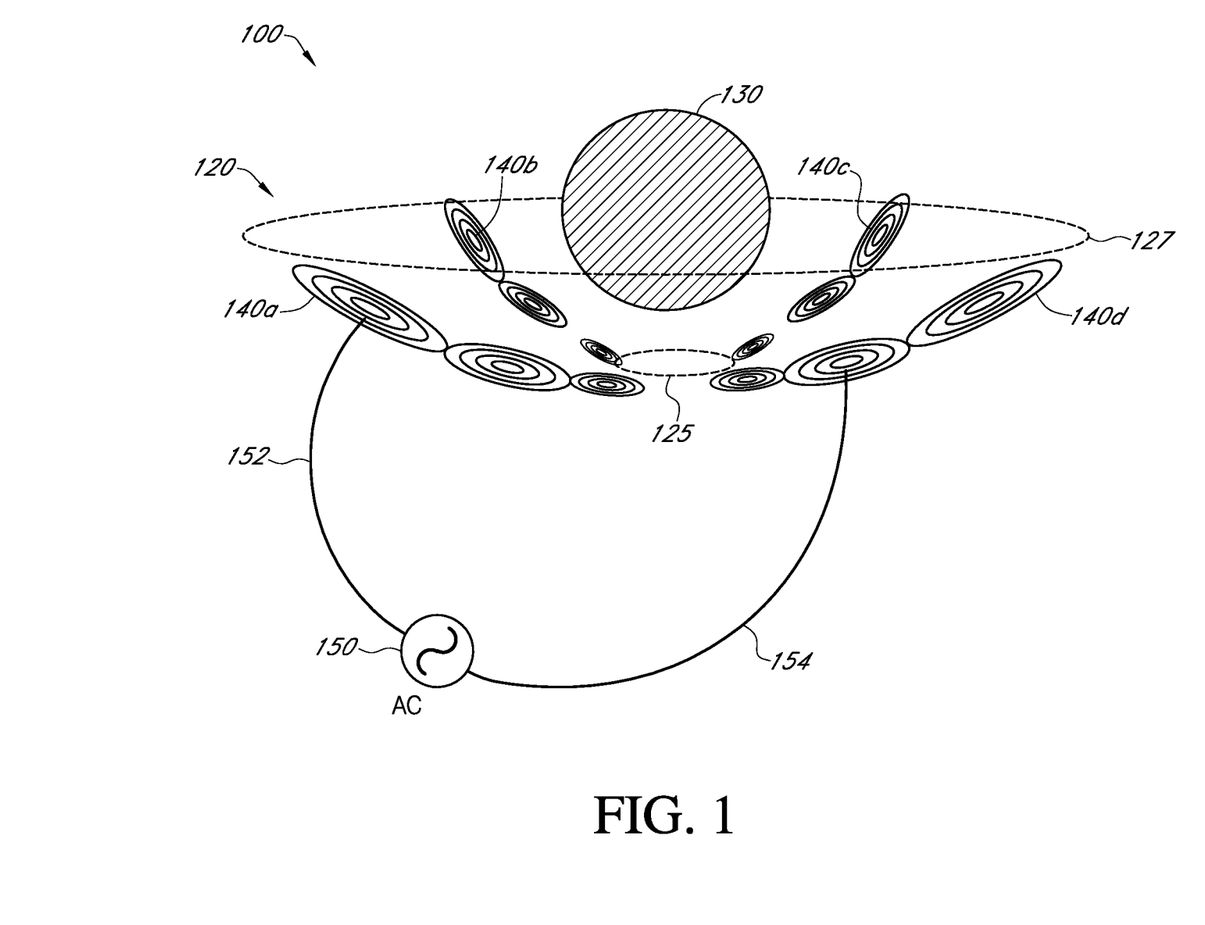
FIG. 1 is a schematic view of an implementation of a magnetic imaging apparatus, according to various embodiments.

FIG. 1 shows a schematic view of an example implementation of a magnetic imaging apparatus 100, in accordance with various embodiments. As shown in FIG. 1, the apparatus 100 includes a single-sided gradient coil set 120 that is configured to project a gradient magnetic field outwards away from the coil set 120 and within a field of view 130. In various implementations, the field of view 130 is a region of interest for magnetic resonance imaging (i.e., imaging region) where a patient resides. Since the patient resides in the field of view 130 away from the coil set 120, the apparatus 100 is suitable for use in a single-sided MRI system.

As shown in the figure, the coil set 120 includes variously sized spiral coils in various sets of spiral coils 140a, 140b, 140c, and 140d (collectively referred to as "spiral coils 140"). Each set of the spiral coils 140 include at least one spiral coil and FIG. 1 is shown to include 3 spiral coils. In accordance with various embodiments, each spiral coil in the spiral coils 140 has an electrical contact at its center and an electrical contact output on the outer edge of the spiral coil so as to form a single running loop of electrically conducting material spiraling out from the center to the outer edge, or vice versa. In accordance with various embodiments, each spiral coil in the spiral coils 140 has a first electrical contact at a first position of the spiral coil and a second electrical contact at a second position the spiral coil so as to form a single running loop of electrically conducting material from the first position to the second position, or vice versa.

In accordance with various embodiments, the coil set 120 has a lateral dimension between about 0.001 mm to about 15 m. In various implementations, the coil set 120 has a lateral dimension between about 0.001 m and about 10 m, between about 0.01 m and about 8 m, between about 0.03 m and about 6 m, between about 0.05 m and about 5 m, between about 0.1 m and about 3 m, between about 0.2 m and about 2 m, between about 0.3 m and about 1.5 m, between about 0.5 m and about 1 m, or between about 0.01 m and about 3 m, inclusive of any lateral dimension therebetween.

As shown in FIG. 1, the coil set 120 also includes an aperture 125 at its center where the spiral coils 140 are disposed around the aperture 125. The aperture 125 itself does not contain any coil material within it for generating magnetic material. The coil set 120 also includes an opening 127 on the outer edge of the coil set 120 to which the spiral coils 140 can be disposed. Said another way, the aperture 125 and the opening 127 define the boundaries of the coil set 120 within which the spiral coils 140 can be disposed. In accordance with various embodiments, the coil set 120 forms a bowl shape with a hole in the center.

In accordance with various embodiments, the spiral coils 140 form across the aperture 125. For example, the spiral coils 140a are disposed across from the spiral coils 140c with respect to the aperture 125. Similarly, the spiral coils 140b are disposed across from the spiral coils 140d with respect to the aperture 125. In accordance with various embodiments, the spiral coils 140a and 140c are formed across from each other. In accordance with various embodiments, the spiral coils 140b and 140d are formed across from each other. In accordance with various embodiments, the spiral coils 140 in the coil set 120 shown in FIG. 1 are configured to create spatial encoding in the magnetic gradient field within the field of view 130.

As shown in FIG. 1, the coil set 120 is also connected to a power source 150 via electrical contacts 152 and 154 by attaching the electrical contacts 152 and 154 to one or more of the spiral coils 140. In various implementations, the electrical contact 152 is connected to one of the spiral coils 140, which is then connected to other spiral coils 140 in series and/or in parallel, and one other spiral coil 140 is then connected to the electrical contact 154 so as to form an electrical current loop. In various implementations, the spiral coils 140 are all electrically connected in series. In various implementations, the spiral coils 140 are all electrically connected in parallel. In various implementations, some of the spiral coils 140 are electrically connected in series while other spiral coils 140 are electrically connected in parallel. In various implementations, the spiral coils 140a are electrically connected in series while the spiral coils 140b are electrically connected in parallel. In various implementations, the spiral coils 140c are electrically connected in series while the spiral coils 140d are electrically connected in parallel. The electrical connections between each spiral coil in the spiral coils 140 or each set of spiral coils 140 can be configured as needed to generate the magnetic field in the field of view 130.

In various implementations, the coil set 120 includes the spiral coils 140 spread out as shown in FIG. 1. In accordance with various embodiments, each of the sets of spiral coils 140a, 140b, 140c, and 140d are configured in a line from the aperture 125 to the opening 127 so that each set of spiral coils is set apart from another by an angle of 90°. In accordance with various embodiments, 140a and 140b are set at 45° from one another, and 140c and 140d are set at 45° from one another, while 140c is set 135° on the other side of 140b and 140d is set 135° on the other side of 140a. In essence, any of the sets of spiral coils 140 can be configured in any arrangement for any number "n" of sets of spiral coils 140.

In various implementations, the spiral coils 140 have the same diameter. In accordance with various embodiments, each of the sets of spiral coils 140a, 140b, 140c, and 140d have the same diameter. In accordance with various embodiments, the spiral coils 140 have different diameters. In accordance with various embodiments, each of the sets of spiral coils 140a, 140b, 140c, and 140d have different diameters. In accordance with various embodiments, the spiral coils in each of the sets of spiral coils 140a, 140b, 140c, and 140d have different diameters. In accordance with various embodiments, 140a and 140b have the same first diameter and 140c and 140d have the same second diameter, but the first diameter and the second diameter are not the same.

In accordance with various embodiments, each spiral coil in the spiral coils 140 has a diameter between about 10 µm and about 10 m. In accordance with various embodiments, each spiral coil in the spiral coils 140 has a diameter between about 0.001 m and about 9 m, between about 0.005 m and about 8 m, between about 0.01 m and about 6 m, between about 0.05 m and about 5 m, between about 0.1 m and about 3 m, between about 0.2 m and about 2 m, between about 0.3 m and about 1.5 m, between about 0.5 m and about 1 m, or between about 0.01 m and about 3 m, inclusive of any diameter therebetween.

In accordance with various embodiments, the spiral coils 140 are connected to form a single electrical circuit loop (or single current loop). As shown in FIG. 1, for example, one spiral coil in the spiral coils 140 is connected to the electrical contact 152 of the power source 150 and another spiral coil be connected to the electrical contact 154 so that the spiral coils 140 completes an electrical circuit.

In accordance with various embodiments, the coil set 120 generates an electromagnetic field strength (also referred to herein as "electromagnetic field gradient" or "gradient magnetic field") between about 1 µT and about 10 T. In accordance with various embodiments, the coil set 120 can generate an electromagnetic field strength between about 100 µT and about 1 T, about 1 mT and about 500 mT, or about 10 mT and about 100 mT, inclusive of any magnetic field strength therebetween. In accordance with various embodiments, the coil set 120 can generate an electromagnetic field strength greater than about 1 µT, about 10 µT, about 100 µT, about 1 mT, about 5 mT, about 10 mT, about 20 mT, about 50 mT, about 100 mT, or about 500 mT.

In accordance with various embodiments, the coil set 120 generates an electromagnetic field that is pulsed at a rate with a rise-time less than about 100 µs. In accordance with various embodiments, the coil set 120 generates an electromagnetic field that is pulsed at a rate with a rise-time less than about 1 µs, about 5 µs, about 10 µs, about 20 µs, about 30 µs, about 40 µs, about 50 µs, about 100 µs, about 200 µs, about 500 µs, about 1 ms, about 2 ms, about 5 ms, or about 10 ms.

In accordance with various embodiments, the coil set 120 is oriented to partially surround the region of interest 130. In accordance with various embodiments, the spiral coils 140 are non-planar to each other. In accordance with various embodiments, the sets of spiral coils 140a, 140b, 140c, and 140d are non-planar to each other. Said another way, the spiral coils 140 and each of the sets of spiral coils 140a, 140b, 140c, and 140d form a three-dimensional structure that surrounds the region of interest 130 where a patient resides.

In accordance with various embodiments, the spiral coils 140 include the same material. In accordance with various embodiments, the spiral coils 140 include different materials. In accordance with various embodiments, the spiral coils in set 140a include the same first material, the spiral coils in set 140b include the same second material, the spiral coils in set 140c include the same third material, the spiral coils in set 140d include the same fourth material, but the first, second, third and fourth materials are different materials. In accordance with various embodiments, the first and second materials are the same material, but that same material is different from the third and fourth materials, which are the same. In essence, any of the spiral coils 140 can be of the same material or different materials depending on the configuration of the coil set 120.

In accordance with various embodiments, the spiral coils 140 include hollow tubes or solid tubes. In accordance with various embodiments, the spiral coils 140 include one or more windings. In accordance with various embodiments, the windings include litz wires or any electrical conducting wires. In accordance with various embodiments, the spiral coils 140 include copper, aluminum, silver, silver paste, or any high electrical conducting material, including metal, alloys or superconducting metal, alloys or non-metal. In accordance with various embodiments, the spiral coils 140 include metamaterials.

In accordance with various embodiments, the coil set 120 includes one or more electronic components for tuning the magnetic field. The one or more electronic components can include a PIN diode, a mechanical relay, a solid state relay, or a switch, including a micro-electro-mechanical system (MEMS) switch. In accordance with various embodiments, the coil can be configured to include any of the one or more electronic components along the electrical circuit. In accordance with various embodiments, the one or more components can include mu metals, dielectrics, magnetic, or metallic components not actively conducting electricity and can tune the coil. In accordance with various embodiments, the one or more electronic components used for tuning includes at least one of conductive metals, metamaterials, or magnetic metals. In accordance with various embodiments, tuning the electromagnetic field includes changing the current or by changing physical locations of the one or more electronic components. In accordance with various embodiments, the coil is cryogenically cooled to reduce resistance and improve efficiency.

Figure 2:
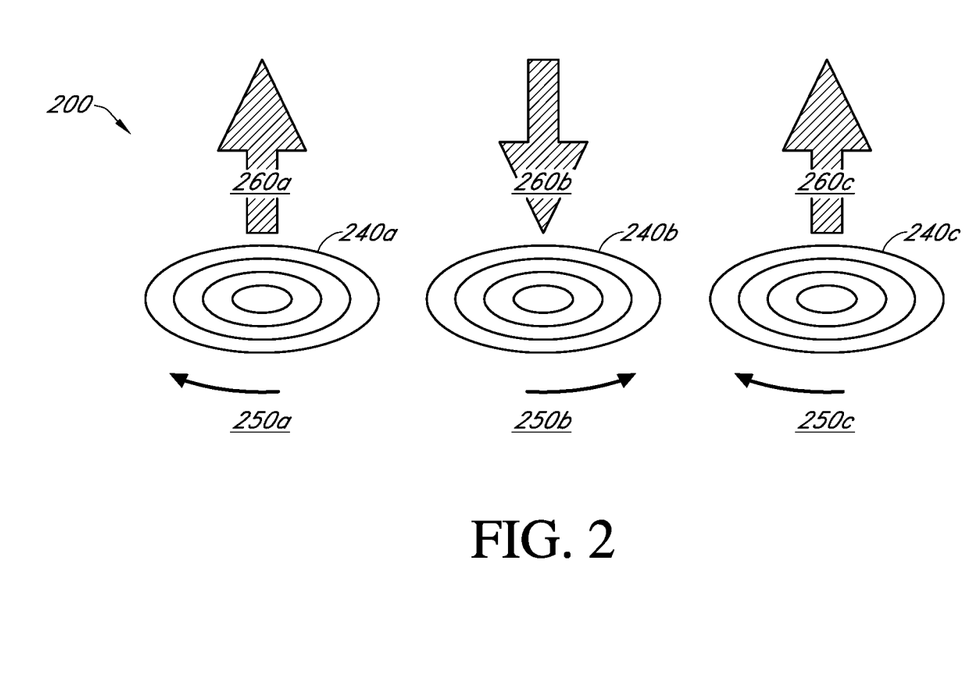
FIG. 2 is a schematic view of an implementation of a single-sided gradient coil set, according to various embodiments.

FIG. 2 is a schematic view of an implementation of a single-sided gradient coil set 200. As shown in the figure, the coil set 200 includes spiral coils 240a, 240b, and 240c arranged laterally adjacent to one another at a separation distance. Although only 3 spiral coils are shown in FIG. 2 for illustrative purposes to convey the general concept of the spiral coils in the coil set 200, the illustration should be non-limiting to the technology as described herein. A current source (not shown) is connected to each of the spiral coils 240a, 240b, and 240c to provide a current in directions 250a, 250b, and 250c as shown in FIG. 2. The current directions 250a, 250b, and 250c that flow through the spiral coils 240a, 240b, and 240c generate respective magnetic fields 260a, 260b, and 260c. As illustrated, the direction, magnitude, uniformity, etc., for each of the magnetic fields 260a, 260b, and 260c generated by the respective spiral coils 240a, 240b, and 240c can be specifically configured to obtain the desired overall electromagnetic field or gradient field profile.

The configuration shown in FIG. 2 can be used, for example, to diminish the effects of magnetic field harmonics, by having the middle spiral coil 240b running the current in opposing directions of the two other spiral coils 240a and 240c. In accordance with various embodiments, the spiral coil 240b can be configured to generate the majority of magnetic field, while the spiral coils 240a and 240c are configured to correct for the harmonics and non-linearity of the magnetic field generated by the spiral coil 240b. In essence, any possible configuration can be implemented using the technology described herein to shape and form a desired electromagnetic field or field gradient to help with MRI imaging.

In accordance with various embodiments, the opposing current directions in the spiral coils 240a, 240b, and 240c can help with decreasing the electromagnetic gradient coil current rise time. In accordance with various embodiments, the electromagnetic field gradient has a rise time less than about 1 µs, about 5 µs, about 10 µs, about 20 µs, about 30 µs, about 40 µs, about 50 µs, about 100 µs, about 200 µs, about 500 µs, about 1 ms, about 2 ms, about 5 ms, or about 10 ms.

In accordance with various embodiments, the opposing current directions help with lowering the coupling inductance between the spiral coils 240a, 240b, and 240c. In accordance with various embodiments, the coupling inductance between the spiral coils 240a, 240b, and 240c is lowered by between about 1% and about 80%, about 5% and about 60%, about 10% and about 40%, about 15% and about 30%, or about 1% and about 10%, inclusive of any ranges therebetween.

Figure 3:
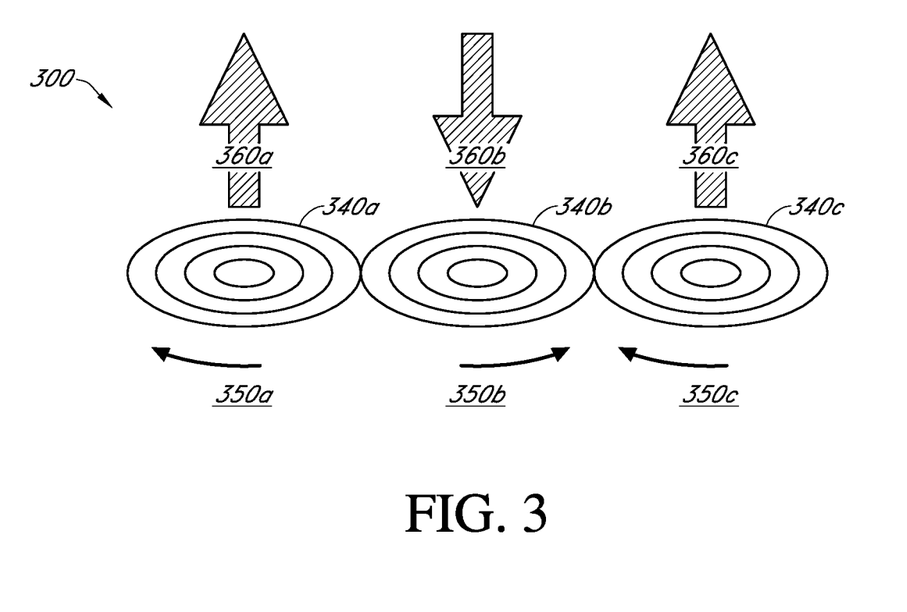
FIG. 3 is a schematic view of an implementation of a single-sided gradient coil set, according to various embodiments.

FIG. 3 is a schematic view of an implementation of a single-sided gradient coil set 300. As shown in the figure, the coil set 300 includes spiral coils 340a, 340b, and 340c arranged laterally adjacent to one another so that the spiral coils are touching. A current source (not shown) is connected to each of the spiral coils 340a, 340b, and 340c to provide a current in directions 350a, 350b, and 350c as shown in FIG. 3. The current directions 350a, 350b, and 350c that flow through the spiral coils 340a, 340b, and 340c generate respective magnetic fields 360a, 360b, and 360c. Similar to the coil set 200 of FIG. 2, the magnitude, uniformity, etc., for each of the magnetic fields 360a, 360b, and 360c generated by the respective spiral coils 340a, 340b, and 340c can be specifically configured to obtain the desired overall electromagnetic field or gradient field profile.

The configuration shown in FIG. 3 can also be used to diminish the effects of magnetic field harmonics as discussed with respect to FIG. 2. In accordance with various embodiments, the opposing current directions in the spiral coils 340a, 340b, and 340c can help with decreasing the electromagnetic gradient coil current rise time. Since the spiral coils 340a, 340b, and 340c are closer to one another as compared to the spiral coils 240a, 240b, and 240c, the diminishing effects is more enhanced in the decreasing of the gradient coil current rise time. In accordance with various embodiments, the electromagnetic field gradient generated by the spiral coils 340a, 340b, and 340c has a rise time less than about 0.1 µs, about 0.5 µs, about 1 µs, about 5 µs, about 10 µs, about 20 µs, about 30 µs, about 40 µs, about 50 µs, about 100 µs, about 200 µs, about 500 µs, about 1 ms, about 2 ms, about 5 ms, or about 10 ms.

In accordance with various embodiments, the opposing current directions help with lowering the coupling inductance between the spiral coils 340a, 340b, and 340c. In essence, the opposing current directions of closer spiral coils can help with further lowering the coupling inductance between the spiral coils 340a, 340b, and 340c as compared to the spiral coils 240a, 240b, and 240c. In accordance with various embodiments, the coupling inductance between the spiral coils 340a, 340b, and 340c is lowered by between about 1% and about 90%, about 5% and about 60%, about 10% and about 40%, about 15% and about 30%, or about 1% and about 10%, inclusive of any ranges therebetween.

Figure 4:
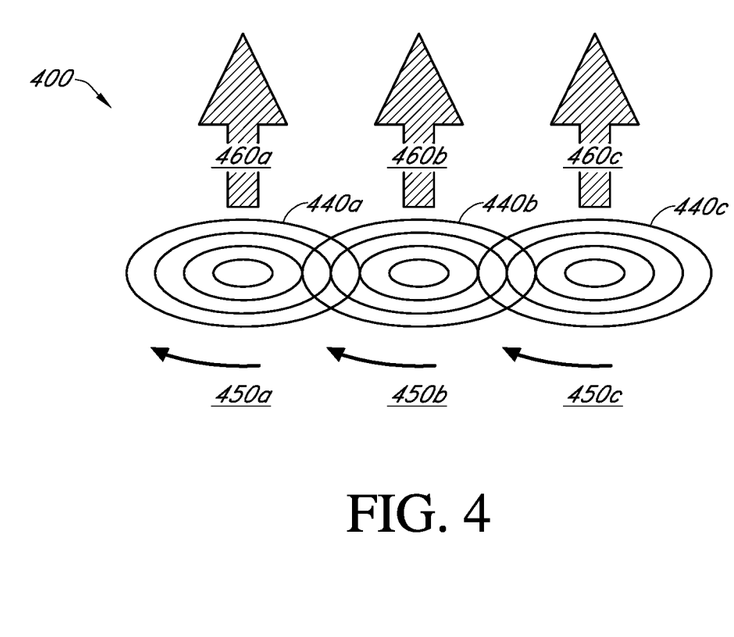
FIG. 4 is a schematic view of an implementation of a single-sided gradient coil set, according to various embodiments.

FIG. 4 is a schematic view of an implementation of a single-sided gradient coil set 400. As shown in the figure, the coil set 400 includes spiral coils 440a, 440b, and 440c that are overlapping one another. A current source (not shown) is connected to each of the spiral coils 440a, 440b, and 440c to provide a current in the same directions 450a, 450b, and 450c as shown in FIG. 4. The same current directions 450a, 450b, and 450c that flow through the spiral coils 440a, 440b, and 440c generate the same direction of magnetic fields 460a, 460b, and 460c. Similar to the coil set 200 of FIG. 2 and coil set 300 of FIG. 3, the magnitude, uniformity, etc., for each of the magnetic fields 460a, 460b, and 460c generated by the respective spiral coils 440a, 440b, and 440c can be specifically configured to obtain the desired overall electromagnetic field or gradient field profile. However, the same direction of overlapping spiral coils 440a, 440b, and 440c magnetically decouple the spiral coils 440a, 440b, and 440c. The overlap of the spiral coils 440a, 440b, and 44 allows for the magnetic field within one coil (e.g., spiral coil 440b) to increase the magnetic field within the overlapping coils (e.g., spiral coil 440a and 440c), and vice versa.

Figure 5:
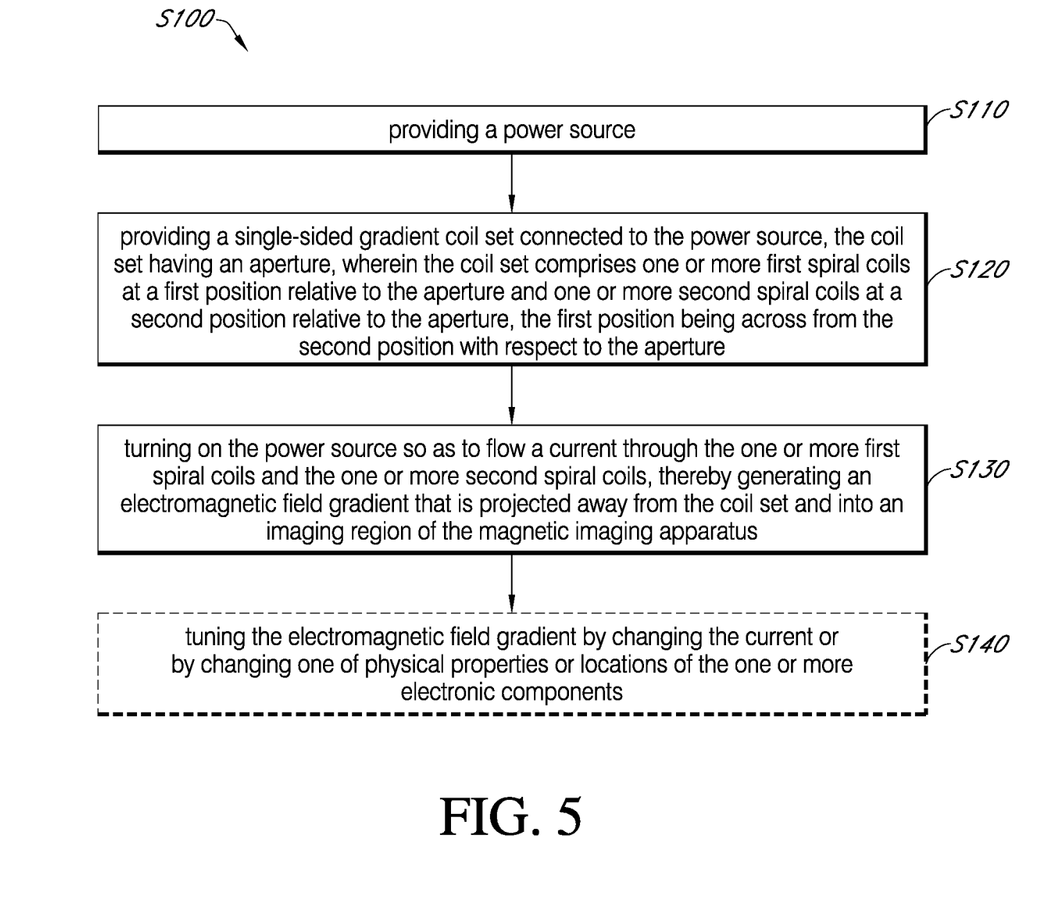
FIG. 5 is a flowchart for a method for using a magnetic imaging apparatus, according to various embodiments.

FIG. 5 is a flowchart for a method S100 for using a magnetic imaging apparatus, according to various embodiments. In accordance with various embodiments, the method S100 includes providing a power source at step S110.

In accordance with various embodiments, the method S100 includes providing a single-sided gradient coil set connected to the power source at step S120. In accordance with various embodiments, the coil set includes an aperture and one or more first spiral coils at a first position relative to the aperture and one or more second spiral coils at a second position relative to the aperture. In accordance with various embodiments, the first position being across from the second position with respect to the aperture.

As shown in FIG. 5, the method S100 includes, at step S130, turning on the power source so as to flow a current through the one or more first spiral coils and the one or more second spiral coils. In accordance with various embodiments, the current flow generates an electromagnetic field gradient that is projected away from the coil set and into an imaging region of the magnetic imaging apparatus.

In accordance with various embodiments, the electromagnetic field gradient is greater than about 5 mT. In accordance with various embodiments, the electromagnetic field gradient has a rise time less than about 10 µs. In accordance with various embodiments, the coil set further includes one or more electronic components from one of a PIN diode, a mechanical relay, a solid state relay, or a MEMS switch.

In accordance with various embodiments, the method S100 optionally includes, at step S140, tuning the electromagnetic field gradient by changing the current or by changing one of physical properties or locations of the one or more electronic components.

In accordance with various embodiments, the coil set further includes an opening opposite the aperture, wherein the region between the aperture and the opening defines a coil set region, and wherein the imaging region is at least partially disposed outside the coil set region.

Figure 6:
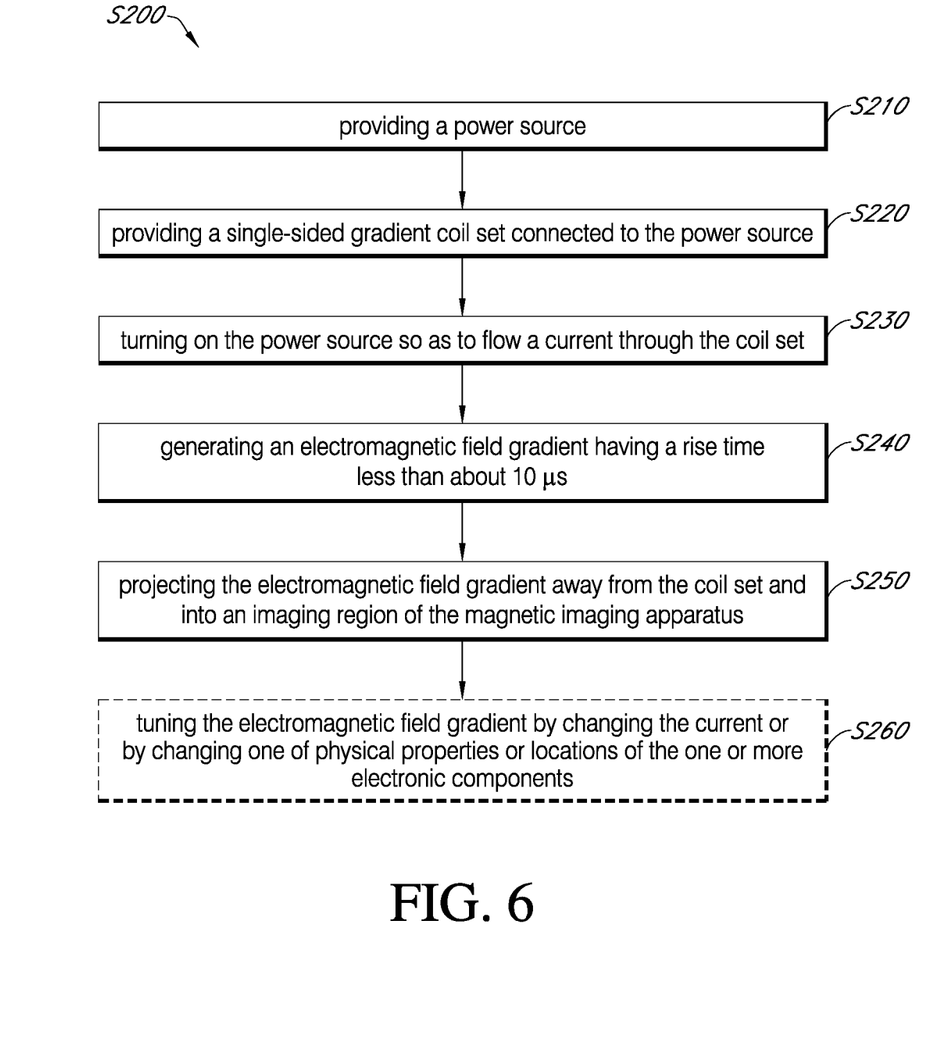
FIG. 6 is a flowchart for another method for using a magnetic imaging apparatus, according to various embodiments.

FIG. 6 is a flowchart for a method S200 for using a magnetic imaging apparatus, according to various embodiments. In accordance with various embodiments, the method S200 includes providing a power source at step S210.

In accordance with various embodiments, the method S200 includes providing a single-sided gradient coil set connected to the power source at step S220.

As shown in FIG. 6, the method S200 includes turning on the power source so as to flow a current through the coil set, at step S230.

In accordance with various embodiments, the method S200 includes generating an electromagnetic field gradient having a rise time less than about 10 µs, at step S240.

In accordance with various embodiments, the method S200 includes projecting the electromagnetic field gradient away from the coil set and into an imaging region of the magnetic imaging apparatus, at step S250.

In accordance with various embodiments, the electromagnetic field gradient is greater than about 5 mT. In accordance with various embodiments, the electromagnetic field gradient has a rise time less than about 10 µs. In accordance with various embodiments, the coil set further includes one or more electronic components from one of a PIN diode, a mechanical relay, a solid state relay, or a MEMS switch.

In accordance with various embodiments, the method S200 optionally includes, at step S260, tuning the electromagnetic field gradient by changing the current or by changing one of physical properties or locations of the one or more electronic components.

In accordance with various embodiments, the coil set further includes an aperture and one or more first spiral coils at a first position relative to the aperture and one or more second spiral coils at a second position relative to the aperture. In accordance with various embodiments, the first position being across from the second position with respect to the aperture.

In accordance with various embodiments, the coil set further includes an opening opposite the aperture, wherein the region between the aperture and the opening defines a coil set region, and wherein the imaging region is at least partially disposed outside the coil set region.

Recitation of Embodiments

1. A magnetic imaging apparatus comprising: a power source for providing a current; and a single-sided gradient coil set connected to the power source, the coil set having an aperture, wherein the coil set comprises one or more first spiral coils at a first position relative to the aperture and one or more second spiral coils at a second position relative to the aperture, the first position being across from the second position with respect to the aperture, and wherein the coil set is configured to receive a current through the one or more first spiral coils and the one or more second spiral coils, thereby generating an electromagnetic field gradient configured to project away from the coil set and into an imaging region of the magnetic imaging apparatus.

2. The apparatus of embodiment 1, wherein the coil set is non-planar and oriented to partially surround the imaging region.

3. The apparatus of anyone of embodiments 1-2, wherein the one or more first spiral coils and the one or more second spiral coils are non-planar with respect to the aperture and mirror each other with respect to the aperture.

4. The apparatus of anyone of embodiments 1-3, wherein the electromagnetic field gradient is substantially uniform in the imaging region.

5. The apparatus of anyone of embodiments 1-4, wherein the electromagnetic field gradient is greater than about 5 mT.

6. The apparatus of anyone of embodiments 1-5, wherein the electromagnetic field gradient has a rise time less than about 10 µs.

7. The apparatus of anyone of embodiments 1-6, wherein the one or more first spiral coils comprise at least two first spiral coils with at least two different diameters.

8. The apparatus of embodiment 7, wherein the one or more second spiral coils comprise at least two second spiral coils with at least two different diameters.

9. The apparatus of anyone of embodiments 1-8, wherein the current is configured to flow through the one or more first spiral coils in alternating directions.

10. The apparatus of embodiment 9, wherein the current is configured to flow through the one or more second spiral coils in alternating directions to minimize a rise time of the electromagnetic field gradient.

11. The apparatus of anyone of embodiments 1-10, wherein a primary first spiral coil of the one or more first spiral coils is configured to create a first large primary electromagnetic field gradient and a secondary first spiral coil of the one or more first spiral coils is configured to create a first small secondary electromagnetic field gradient to provide adjustments in the first large primary electromagnetic field gradient.

12. The apparatus of embodiment 11, wherein a primary second spiral coil of the one or more second spiral coils creates a second large primary electromagnetic field gradient and a secondary second spiral coil of the one or more second spiral coils is configured to create a second small secondary electromagnetic field gradient to provide adjustments in the second large primary electromagnetic field gradient.

13. The apparatus of anyone of embodiments 1-12, wherein a primary first spiral coil of the one or more first spiral coils and a secondary first spiral coil of the one or more first spiral coils adjacent to the primary first spiral coil have the current flowing through them in opposite directions.

14. The apparatus of embodiment 13, wherein a primary second spiral coil of the one or more second spiral coils and a secondary second spiral coil of the one or more second spiral coils adjacent to the primary second spiral coil have the current flowing through them in opposite directions.

15. The apparatus of anyone of embodiments 1-14, wherein a primary first spiral coil of the one or more first spiral coils and a secondary first spiral coil of the one or more first spiral coils adjacent to the primary first spiral coil overlap up to 50% of respective coils to generate a more parallel first electromagnetic field gradient.

16. The apparatus of embodiment 15, wherein a primary second spiral coil of the one or more second spiral coils and a secondary second spiral coil of the one or more second spiral coils adjacent to the primary second spiral coil overlap up to 50% of respective coils to generate a more parallel second electromagnetic field gradient.

17. The apparatus of anyone of embodiments 1-16, wherein the one or more first spiral coils and the one or more second spiral coils are connected to form a single current loop.

18. The apparatus of anyone of embodiments 1-17, wherein the one or more first spiral coils and the one or more second spiral coils comprise different materials.

19. The apparatus of anyone of embodiments 1-18, wherein the one or more first spiral coils and the one or more second spiral coils have diameters between about 10 µm to about 10 m.

20. The apparatus of anyone of embodiments 1-19, wherein the coil set further comprises one or more electronic components for tuning the electromagnetic field gradient.

21. The apparatus of embodiment 20, wherein the one or more electronic components include at least one of a PIN diode, a mechanical relay, a solid state relay, or a MEMS switch.

22. The apparatus of anyone of embodiments 1-21, wherein the one or more electronic components used for tuning includes at least one of dielectrics, conductive metals, metamaterials, or magnetic metals.

23. The apparatus of embodiment 22, wherein tuning the electromagnetic field gradient includes changing the current or changing physical locations of the one or more electronic components.

24. The apparatus of anyone of embodiments 1-23, wherein the coil set is cryogenically cooled to reduce resistance and improve efficiency.

25. The apparatus of anyone of embodiments 1-24, wherein the coil set further comprises an opening opposite the aperture, wherein the region between the aperture and the opening defines a coil set region, and wherein the imaging region is at least partially disposed outside the coil set region.

26. A method for using a magnetic imaging apparatus comprising: providing a power source; providing a single-sided gradient coil set connected to the power source, the coil set having an aperture, wherein the coil set comprises one or more first spiral coils at a first position relative to the aperture and one or more second spiral coils at a second position relative to the aperture, the first position being across from the second position with respect to the aperture; and turning on the power source so as to flow a current through the one or more first spiral coils and the one or more second spiral coils, thereby generating an electromagnetic field gradient that is projected away from the coil set and into an imaging region of the magnetic imaging apparatus.

27. The method of embodiment 26, wherein the electromagnetic field gradient is greater than about 5 mT.

28. The method of anyone of embodiments 26-27, wherein the electromagnetic field gradient has a rise time less than about 10 μs.

29. The method of anyone of embodiments 26-28, wherein the coil set further comprises one or more electronic components from one of a PIN diode, a mechanical relay, a solid state relay, or a MEMS switch.

30. The method of embodiment 29, further comprising: tuning the electromagnetic field gradient by changing the current or by changing one of physical properties or locations of the one or more electronic components.

31. The method of anyone of embodiments 26-30, wherein the coil set further comprises an opening opposite the aperture, wherein the region between the aperture and the opening defines a coil set region, and wherein the imaging region is at least partially disposed outside the coil set region.

32. A magnetic imaging apparatus comprising: a power source for providing a current; and a single-sided gradient coil set connected to the power source, wherein the coil set is configured to generate an electromagnetic field gradient having a rise time less than about 10 us and configured to project away from the coil set and into an imaging region of the magnetic imaging apparatus.

33. The apparatus of embodiment 32, wherein the coil set further comprising: an aperture, and one or more first spiral coils at a first position relative to the aperture and one or more second spiral coils at a second position relative to the aperture, the first position being across from the second position with respect to the aperture.

34. The apparatus of anyone of embodiments 32-33, wherein the coil set is non-planar and oriented to partially surround the imaging region.

35. The apparatus of anyone of embodiments 33-34, wherein the one or more first spiral coils and the one or more second spiral coils are non-planar with respect to the aperture and mirror each other with respect to the aperture.

36. The apparatus of anyone of embodiments 32-35, wherein the electromagnetic field gradient is substantially uniform in the imaging region.

37. The apparatus of anyone of embodiments 32-36, wherein the electromagnetic field gradient is greater than about 5 mT.

38. The apparatus of anyone of embodiments 33-37, wherein the one or more first spiral coils comprise at least two first spiral coils with at least two different diameters.

39. The apparatus of embodiment 38, wherein the one or more second spiral coils comprise at least two second spiral coils with at least two different diameters.

40. The apparatus of anyone of embodiments 33-39, wherein the current is configured to flow through the one or more first spiral coils in alternating directions.

41. The apparatus of embodiment 40, wherein the current is configured to flow through the one or more second spiral coils in alternating directions to minimize a rise time of the electromagnetic field gradient.

42. The apparatus of anyone of embodiments 33-41, wherein a primary first spiral coil of the one or more first spiral coils is configured to create a first large primary electromagnetic field gradient and a secondary first spiral coil of the one or more first spiral coils is configured to create a first small secondary electromagnetic field gradient to provide adjustments in the first large primary electromagnetic field gradient.

43. The apparatus of embodiment 42, wherein a primary second spiral coil of the one or more second spiral coils creates a second large primary electromagnetic field gradient and a secondary second spiral coil of the one or more second spiral coils is configured to create a second small secondary electromagnetic field gradient to provide adjustments in the second large primary electromagnetic field gradient.

44. The apparatus of anyone of embodiments 33-43, wherein a primary first spiral coil of the one or more first spiral coils and a secondary first spiral coil of the one or more first spiral coils adjacent to the primary first spiral coil have the current flowing through them in opposite directions.

45. The apparatus of embodiment 44, wherein a primary second spiral coil of the one or more second spiral coils and a secondary second spiral coil of the one or more second spiral coils adjacent to the primary second spiral coil have the current flowing through them in opposite directions.

46. The apparatus of anyone of embodiments 33-45, wherein a primary first spiral coil of the one or more first spiral coils and a secondary first spiral coil of the one or more first spiral coils adjacent to the primary first spiral coil overlap up to 50% of respective coils to generate a more parallel first electromagnetic field gradient.

47. The apparatus of embodiment 46, wherein a primary second spiral coil of the one or more second spiral coils and a secondary second spiral coil of the one or more second spiral coils adjacent to the primary second spiral coil overlap up to 50% of respective coils to generate a more parallel second electromagnetic field gradient.

48. The apparatus of anyone of embodiments 33-47, wherein the one or more first spiral coils and the one or more second spiral coils are connected to form a single current loop.

49. The apparatus of anyone of embodiments 33-48, wherein the one or more first spiral coils and the one or more second spiral coils comprise different materials.

50. The apparatus of anyone of embodiments 33-49, wherein the one or more first spiral coils and the one or more second spiral coils have diameters between about 10 μm to about 10 m.

51. The apparatus of anyone of embodiments 32-50, wherein the coil set further comprises one or more electronic components for tuning the electromagnetic field gradient.

52. The apparatus of embodiment 51, wherein the one or more electronic components include at least one of a PIN diode, a mechanical relay, a solid state relay, or a MEMS switch.

53. The apparatus of anyone of embodiments 32-52, wherein the one or more electronic components used for tuning includes at least one of dielectrics, conductive metals, metamaterials, or magnetic metals.

54. The apparatus of anyone of embodiments 32-53, wherein tuning the electromagnetic field gradient includes changing the current or changing physical locations of the one or more electronic components.

55. The apparatus of anyone of embodiments 32-54, wherein the coil set is cryogenically cooled to reduce resistance and improve efficiency.

56. The apparatus of anyone of embodiments 33-55, wherein the coil set further comprises an opening opposite the aperture, wherein the region between the aperture and the opening defines a coil set region, and wherein the imaging region is at least partially disposed outside the coil set region.

57. A method for using a magnetic imaging apparatus comprising: providing a power source; providing a single-sided gradient coil set connected to the power source; turning on the power source so as to flow a current through the coil set; generating an electromagnetic field gradient having a rise time less than about 10 μs; and projecting the electromagnetic field gradient away from the coil set and into an imaging region of the magnetic imaging apparatus.

58. The method of embodiment 57, wherein the electromagnetic field gradient is greater than about 5 mT.

59. The method of anyone of embodiments 57-58, wherein the coil set further comprises one or more electronic components from one of a PIN diode, a mechanical relay, a solid state relay, or a MEMS switch.

60. The method of embodiment 59, further comprising: tuning the electromagnetic field gradient by changing the current or by changing one of physical properties or locations of the one or more electronic components.

61. The method of anyone of embodiments 57-60, wherein the coil set further comprising: an aperture, and one or more first spiral coils at a first position relative to the aperture and one or more second spiral coils at a second position relative to the aperture, the first position being across from the second position with respect to the aperture.

62. The method of embodiment 61, wherein the coil set further comprises an opening opposite the aperture, wherein the region between the aperture and the opening defines a coil set region, and wherein the imaging region is at least partially disposed outside the coil set region.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A magnetic imaging apparatus comprising:
a power source for providing a current; and
a single-sided gradient coil set connected to the power source,
wherein the coil set comprises a plurality of first spiral coils at a first position relative to an aperture and a plurality of second spiral coils at a second position relative to the aperture, the first position being across from the second position with respect to the aperture,
wherein the coil set is configured to receive the current to generate a combined electromagnetic field gradient configured to project away from the coil set and into an imaging region of the magnetic imaging apparatus, and
wherein the plurality of first spiral coils comprises a primary first spiral coil and a secondary first spiral coil, wherein the primary first spiral coil is configured to create a first large primary electromagnetic field gradient, and wherein the secondary first spiral coil is configured to create a first small secondary electromagnetic field gradient to provide adjustments to the combined electromagnetic field gradient.

2. The apparatus of claim 1, wherein the coil set is non-planar.

3. The apparatus of claim 1, wherein the plurality of first spiral coils and the plurality of second spiral coils are non-planar with respect to the aperture and mirror each other with respect to the aperture.

4. The apparatus of claim 1, wherein the electromagnetic field gradient is substantially uniform in the imaging region.

5. The apparatus of claim 1, wherein the electromagnetic field gradient is greater than about 5 mT.

6. The apparatus of claim 1, wherein the electromagnetic field gradient has a rise time less than about 10 μs.

7. The apparatus of claim 1, wherein the plurality of first spiral coils comprise at least two first spiral coils with at least two different diameters.

8. The apparatus of claim 7, wherein the plurality of second spiral coils comprise at least two second spiral coils with at least two different diameters.

9. The apparatus of claim 1, wherein the current is configured to flow through the primary first spiral coil and the secondary first spiral coil in alternating directions.

10. The apparatus of claim 1, wherein the plurality of second spiral coils comprises a primary second spiral coil and a secondary second spiral coil, wherein the primary second spiral coil is configured to create a second large primary electromagnetic field gradient, and wherein the secondary second spiral coil of the plurality of second spiral coils is configured to create a second small secondary electromagnetic field gradient to provide adjustments in the combined electromagnetic field gradient.

11. The apparatus of claim 10, wherein the current is configured to flow through the primary second spiral coil and the secondary second spiral coil in alternating directions to minimize a rise time of the electromagnetic field gradient.

12. The apparatus of claim 1, wherein the primary first spiral coil and the secondary first spiral coil adjacent to the primary first spiral coil have the current flowing through them in opposite directions.

13. The apparatus of claim 12, wherein the plurality of second spiral coils comprises a primary second spiral coil and a secondary second spiral coil, wherein the primary second spiral coil and the secondary second spiral coil adjacent to the primary second spiral coil have the current flowing through them in opposite directions.

14. The apparatus of claim 1, wherein the plurality of first spiral coils and the plurality of second spiral coils are connected to form a single current loop.

15. The apparatus of claim 1, wherein the plurality of first spiral coils and the plurality of second spiral coils comprise different materials.

16. The apparatus of claim 1, wherein the plurality of first spiral coils and the plurality of second spiral coils have diameters between about 10 μm to about 10 m.

17. The apparatus of claim 1, wherein the coil set further comprises one or more electronic components for tuning the electromagnetic field gradient.

18. The apparatus of claim 17, wherein the one or more electronic components include at least one of a PIN diode, a mechanical relay, a solid state relay, or a MEMS switch.

19. The apparatus of claim 17, wherein the one or more electronic components used for tuning includes at least one of dielectrics, conductive metals, metamaterials, or magnetic metals.

20. The apparatus of claim 19, wherein tuning the electromagnetic field gradient includes changing the current or changing a physical location of the one or more electronic components.

21. The apparatus of claim 1, wherein the coil set is cryogenically cooled to reduce resistance and improve efficiency.

22. A magnetic imaging apparatus comprising:
a power source for providing a current; and
a single-sided gradient coil set connected to the power source,
wherein the coil set comprises plurality of first spiral coils at a first position relative to an aperture and plurality of second spiral coils at a second position relative to the aperture, the first position being across from the second position with respect to the aperture,
wherein the coil set is configured to receive the current through the plurality of first spiral coils and the plurality of second spiral coils, thereby generating an electromagnetic field gradient configured to project away from the coil set and into an imaging region of the magnetic imaging apparatus, and
wherein the plurality of first spiral coils comprises a primary first spiral coil and a secondary first spiral coil, wherein the primary first spiral coil and the secondary first spiral coil adjacent to the primary first spiral coil overlap up to 50% of respective coils to generate a more parallel first electromagnetic field gradient.

23. The apparatus of claim 22, wherein the plurality of second spiral coils comprises a primary second spiral coil and a secondary second spiral coil, wherein the primary second spiral coil and the secondary second spiral coil adjacent to the primary second spiral coil overlap up to 50% of respective coils to generate a more parallel second electromagnetic field gradient.

* * * * *